United States Patent [19]

Nakanishi et al.

[11] Patent Number: 5,403,783
[45] Date of Patent: Apr. 4, 1995

[54] INTEGRATED CIRCUIT SUBSTRATE WITH COOLING ACCELERATOR SUBSTRATE

[75] Inventors: Keiichiro Nakanishi, Tokyo; Tsuneyo Chiba, Kanagawa; Hiroyuki Itoh, Akigawa; Tatsuya Saitoh, Kokubunji; Takeshi Kato, Akishima, all of Japan

[73] Assignee: Hitachi, Ltd., Tokyo, Japan

[21] Appl. No.: 168,762

[22] Filed: Dec. 16, 1993

[30] Foreign Application Priority Data

Dec. 28, 1992 [JP] Japan .................. 4-347811

[51] Int. Cl.⁶ .................................... H01L 21/60
[52] U.S. Cl. .................... 437/209; 437/211; 437/214; 437/217; 437/219
[58] Field of Search ............... 437/206, 207, 209, 211, 437/214, 217, 216, 219, 220, 248; 257/712, 713, 714, 721, 722, 782, 676

[56] References Cited

U.S. PATENT DOCUMENTS

| | | | |
|---|---|---|---|
| 4,620,215 | 10/1986 | Lee | 257/713 |
| 4,753,290 | 6/1988 | Gabuzoa | 257/713 |
| 4,810,672 | 3/1989 | Schwarzbauer | 257/712 |
| 4,867,235 | 9/1989 | Grapes et al. | 257/712 |
| 4,908,696 | 3/1990 | Ishihara et al. | 257/713 |
| 5,169,805 | 12/1992 | Mok et al. | 437/214 |
| 5,175,612 | 12/1992 | Long et al. | 257/626 |
| 5,219,794 | 6/1993 | Satoh et al. | 437/215 |
| 5,249,101 | 7/1993 | Frey et al. | 437/211 |

FOREIGN PATENT DOCUMENTS 60-229353 11/1985 Japan .
4-144158 5/1992 Japan .

OTHER PUBLICATIONS

Tuckerman, D. B. et al. "High-Performance Heat Sinking for VLSI," IEEE Electron Device Letters, vol. EDL-2, No. 5, May 1981, pp. 126-129. (English).

Tuckerman, D. B., et al. "Microcapillary Thermal Interface Technology for VLSI Packaging," Symposium on VLSI Technology, Digest of Technical Paper (3rd), Sep. 1983 (Maui). (English).

Primary Examiner—Brian E. Hearn
Assistant Examiner—Kevin M. Picardat
Attorney, Agent, or Firm—Fay, Sharpe, Beall, Fagan, Minnich & McKee

[57] ABSTRACT

An electronic device includes an integrated circuit device, the integrated circuit device comprises a first substrate including an integrated electronic semiconductor circuit and a second substrate including a cooling accelerator for accelerating a heat energy exchange between the integrated electronic semiconductor circuit and a cooling fluid, and the second substrate is joined fixedly with the first substrate through a covalent bond formed between the first substrate and the second substrate.

11 Claims, 6 Drawing Sheets

INTEGRATED CIRCUIT SUBSTRATE WITH COOLING ACCELERATOR SUBSTRATE

BACKGROUND OF THE INVENTION AND RELATED ART STATEMENT

The present invention relates to joined substrates, one of which has an integrated electronic semiconductor circuit thereon, and another one of which has a cooling accelerator thereon for accelerating a heat energy exchange between the integrated electronic semiconductor circuit and a cooling fluid, and relates to a method for producing the integrated electronic semiconductor circuit substrate and the cooling accelerator substrate joined each other.

IEEE Electron Device Letters, vol. EDL-2, No. 5, pp. 126–129, May 1981 discloses an integrated circuit substrate having cooing accelerator fine fins extending integrally therefrom. Symposium on VLSI Technology Digest of Technical Paper [3rd], Maui, September 1983 discloses an integrated circuit substrate and a microchannel heat sink substrate between which a gap extends to be filled by an interfacial liquid.

Each of Publication of Japanese Unexamined Patent Application Shou-60-229353 and Publication of Japanese Unexamined Patent Application Hei-4-144158 discloses an integrated circuit substrate and a heat exchanger plate connected to each other. In Publication of Shou-60-229353, the heat exchanger plate is formed by joining a plurality of grooved members with diffusion bonding or brazing, and may be made of ceramic or silicon, but these Publications do not disclose a bonding mechanism between the substrate and the plate. Publication of Japanese Patent Shou-39-17869 discloses two silicon-substrates are joined with each other by making them contact each other while heating them in oxygen to form oxide therebetween so that the substrates with respective transistors thereon are connected through the oxide to form a large-size transistor substrate.

OBJECT AND SUMMARY OF THE INVENTION

An object of the present invention is to provide a method for producing joined first and second substrates, the first substrate having an integrated electronic semiconductor circuit thereon, and the second substrate having a cooling accelerator thereon for accelerating a heat energy exchange between the integrated electronic semiconductor circuit and a cooling fluid over the second substrate, whereby the first and second substrates can be prepared separately from each other before joining, and a heat energy generated by the integrated electronic semiconductor circuit can be effectively transmitted from the first substrate to the cooling accelerator on the second substrate, and is to provide a product according to the method.

According to the present invention, a method for producing joined first and second substrates, comprises the steps of:
  preparing the first (semiconductor) substrate for an integrated electronic semiconductor circuit,
  preparing the second substrate for a cooling accelerator for accelerating a heat energy exchange between the integrated electronic semiconductor circuit and a cooling fluid, and
  forming a covalent bond between the first substrate and the second substrate to join fixedly the second substrate with the first substrate, after the preparations.

Since the covalent bond is formed between the first substrate and the second substrate to join fixedly the second substrate with the first substrate after the preparations, the preparation of the first substrate can be performed separately from that of the second substrate, the heat energy transmission from the first substrate to the cooling accelerator on the second substrate is not deteriorated by a joint or interface between the first and second substrates, and the heat energy transmission at the joint is kept substantially equal to the heat energy transmission in the first and second substrates by the covalent bond at the joint.

The first substrate and the second substrate may be connected directly to each other, and the covalent bond is formed by at least a component of the first substrate and at least a component of the second substrate. The first substrate and the second substrate may be connected to each other through an insert member therebetween, and the covalent bond is formed between the first substrate and the insert member, and between the second substrate and the insert member.

The covalent bond may be formed between the first substrate and the insert member by at least a component of the first substrate and at least a component of the insert member, and the covalent bond is formed between the second substrate and the insert member by at least a component of the second substrate and at least another component of the insert member. The covalent bond may be formed between the first substrate and the insert member by at least a component of the first substrate and at least a component of the insert member, and the covalent bond may be formed between the second substrate and the insert member by at least a component of the second substrate and at least the component of the insert member. The insert member may include a first insert element and a second insert element, the covalent bond may be formed between the first substrate and the first insert element by at least a component of the first substrate and at least a component of the first insert element, the covalent bond may be formed between the second substrate and the second insert element by at least a component of the second substrate and at least a component of the second insert element, and the covalent bond may be formed between the first insert element and the second insert element to join fixedly the second insert element with the first insert element.

The insert member may be heated to a temperature not less than a melting temperature thereof. A base component of each of the first and second substrates may be silicon or gallium arsenide (GaAs) compound. A base component of the first insert element may be is identical to or different from that of the second insert element. A base component of the insert member may be gold. The insert member may be essentially composed of lead and tin.

The cooling accelerator may be a surface unevenness of the second substrate for increasing a surface area of the second substrate, a Peltier effect semiconductor element formed on the second substrate, a heat pipe formed in the second substrate, or hole means extending through the second substrate. The second substrate with the Peltier effect semiconductor element or heat pipe may be thermally connected to a fin member for discharging the heat energy from the second substrate to the cooling fluid.

At lease one of a surface of the first substrate and a surface of the second substrate to be joined each other may include oxide, particularly oxide of the first or second substrate. At lease one of a surface of the first substrate and a surface of the second substrate to be directly joined each other may be prevented from including oxide or may include a significantly thin oxide layer thereon as formed by the atmosphere, that is, just before and when the covalent bond starts to be formed, it is preferable for at least one of the surfaces of the first and second substrates which are to be directly joined to be fresh and clean or to include the significantly thin oxide layer (thickness less than 2000 angstroms). When one of the surfaces of the first and second substrates to be directly joined is prevented from including oxide or includes the significantly thin oxide layer, another one thereof may include a significantly thick oxide layer thereon, just before and when the covalent bond starts to be formed. A purity of a base component of the first substrate may be higher than that of the second substrate. The insert member may be joined with at least one of the first and second substrates by the covalent bond with a diffusion bonding.

The covalent bond for joining the second substrate and the first substrate may be formed after or before the integrated electronic semiconductor circuit is substantially formed on the first substrate. The covalent bond for joining the second substrate and the first substrate may be formed before or after the cooling accelerator is substantially formed on the second substrate.

DETAILED DESCRIPTION OF THE PREFERRED EMBODIMENTS

Figure 1:
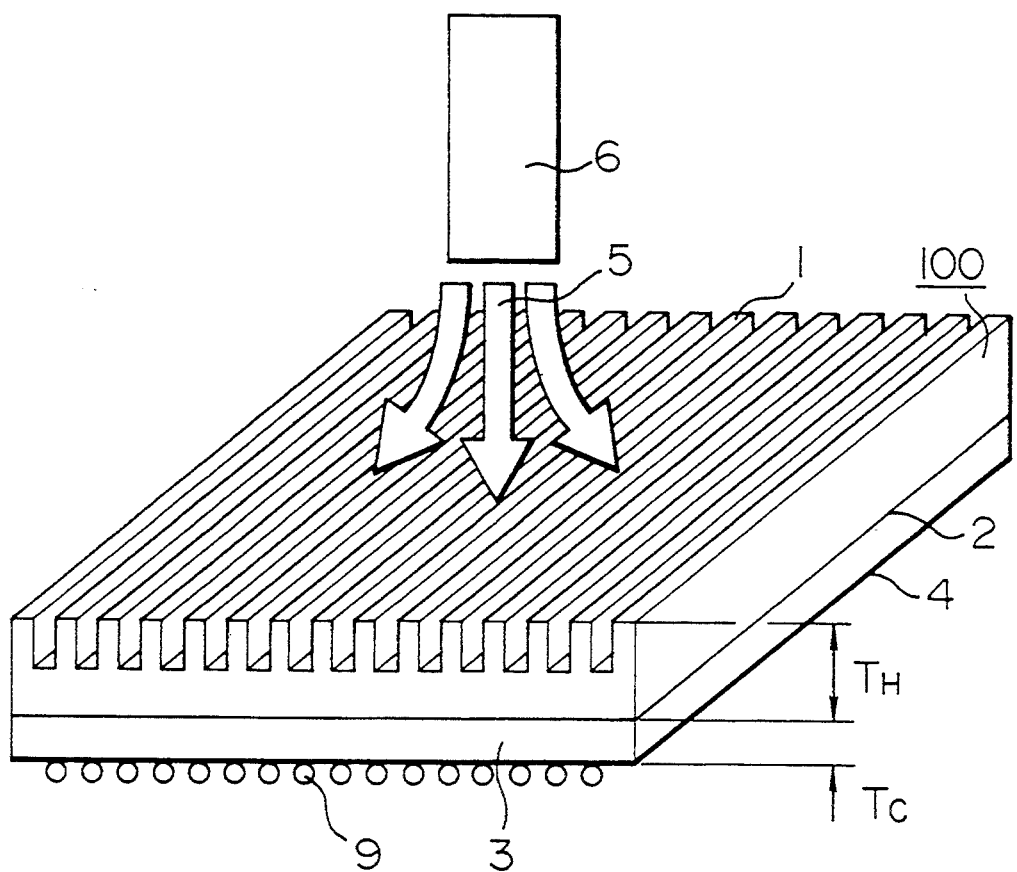
FIG. 1 is a schematic view showing joined substrates according to the present invention.

As shown in FIG. 1, a cooling silicon substrate 100 with fins 1 as the claimed cooling accelerator and an integrated circuit silicon substrate 3 are joined with a covalent bond formed along a joining interface 2. The integrated circuit substrate 3 may be formed of GaAs compound or the like. A surface 4 on which an integrated circuit is formed has electrically conductive terminals 9 for connecting the integrated circuit to an electric wiring (not shown). A height TH of the cooling silicon substrate 100 is larger than a height TC of the integrated circuit silicon substrate 3 so that the cooling silicon substrate 100 has a large heat discharge characteristic. Since the cooling silicon substrate 100 is formed independently of the integrated circuit silicon substrate 3, the height TH of the cooling silicon substrate 100 can be determined freely independently of the height TC of the integrated circuit silicon substrate 3.

When a yield on forming the integrated circuit silicon substrate 3 is A, a yield on forming the cooling silicon substrate 100 is B, and a yield on joining the integrated circuit silicon substrate 3 and the cooling silicon substrate 100 is C, a yield Y1 on forming both the integrated circuit and the cooling fins 1 on one or the identical substrate without the joining is A.B. A yield Y2 on forming the integrated circuit and the cooling fins 1 on respective substrates and subsequently joining the substrates is A.C, because A<B generally. Since B<C generally, Y1<Y2. Therefore, the present invention brings about an advantageous effect.

When a base component of the integrated circuit silicon substrate 3 (for, example, silicon) is equal to that of the cooling silicon substrate 100 for making a thermal expansion coefficiency of the integrated circuit silicon substrate 3 equal to that of the cooling silicon substrate 100, a stress caused by a difference in thermal expansion coefficiency therebetween is prevented. A purity of the base component of the cooling silicon substrate 100 may be smaller than that of the integrated circuit silicon substrate 3 so that a cost for forming the cooling silicon substrate 100 is decreased. The cooling silicon substrate 100 may be formed of polysilicon from which a material substrate of the integrated circuit silicon substrate 3 is refined.

An electrically insulating cooling medium 5 flows out from a nozzle 6 arranged over the cooling silicon substrate 100 toward the fins 1 so that a heat energy from the integrated circuit silicon substrate 3 is absorbed by the medium 5. Since the nozzle 6 is apart from the cooling silicon substrate 100, the terminals 9 is not deformed by the nozzle 6. Further, since the cooling medium 5 is electrically insulating, it is not necessary for the integrated circuit silicon substrate 3 to be insulated from the cooling medium 5.

Figure 2:
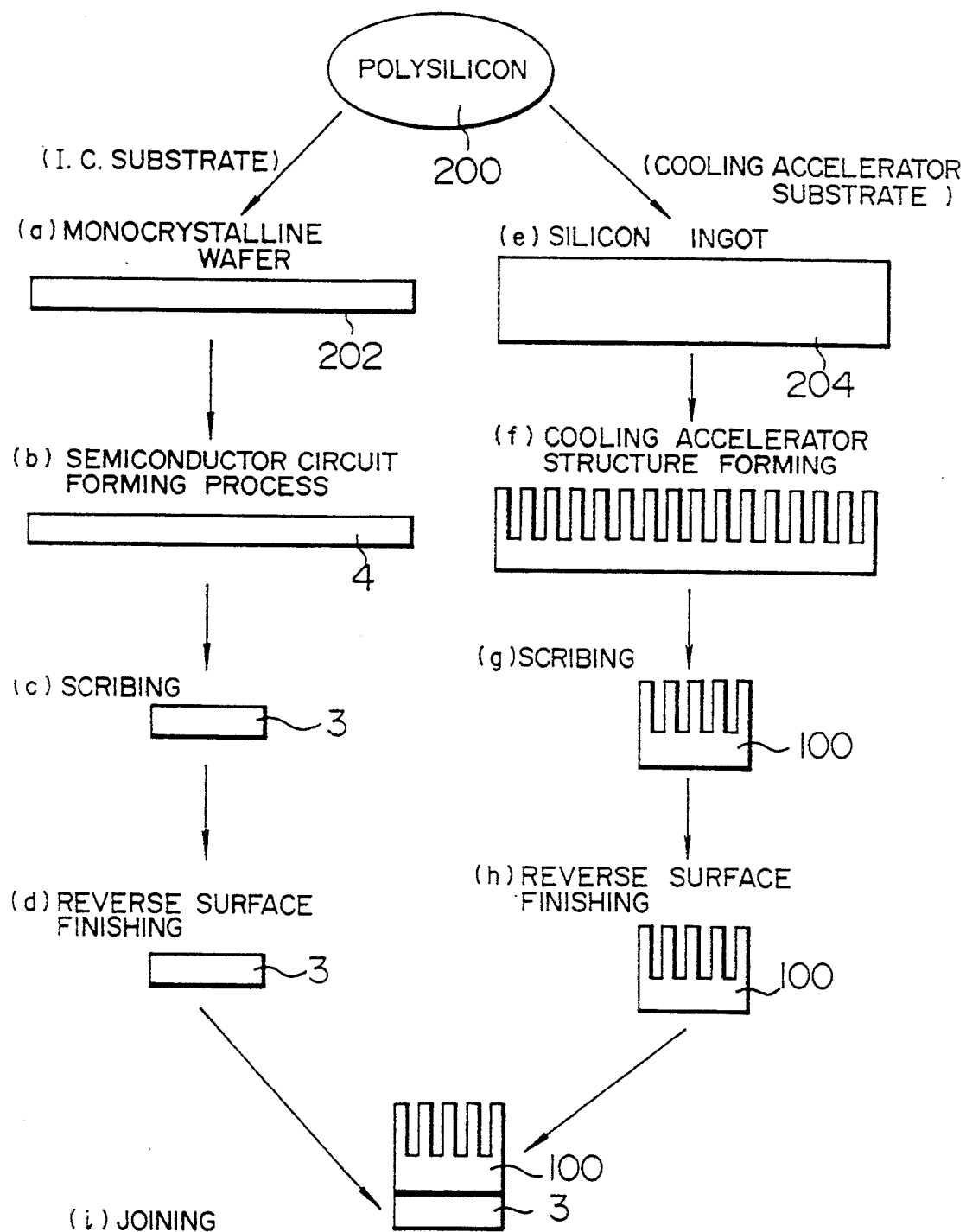
FIG. 2 shows an embodiment of processes for producing the joined substrates according to the present invention.
Figure 3:
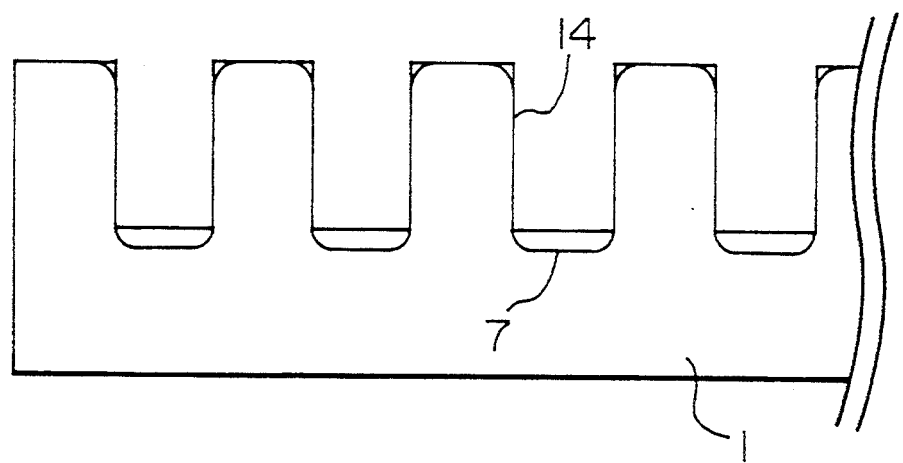
FIG. 3 is a schematic view showing a shaping of cooling fins.

As shown in FIG. 2, the integrated circuit silicon substrate 3 is formed by producing a monocrystaline silicon wafer 202 from a polysilicon ingot 200, forming an integrated semiconductor circuit wafer 4 from the wafer 202 and scribing and dividing the wafer 4 to a plurality of the integrated circuit silicon substrates 3.

The fins 1 may be formed by a cutting process on a polysilicon ingot 204 formed from the polysilicon ingot 200. When a diamond cutter blade of 35 micrometer thickness is used for forming the fin 1 of 50 micrometer width, 100 micrometer pitch and 400 micrometer height, a feed speed of the diamond cutter blade can be kept at 25 mm/second. A residual stress on a surface of the fin 1 can be released by a wet etching in potassium hydroxide solution. The fins 1 may be formed by the wet etching or a dry etching. The residual stress caused by the dry etching may be released by the wet etching thereafter.

When the cooling silicon substrate 100 is fixed to the integrated circuit silicon substrate 3, a temperature of the integrated circuit silicon substrate 3 must be kept not more than 450° C. to prevent a damage of the integrated circuit thereon by the heating. When the temperature is not more than 450° C. the higher the temperature of the cooling silicon substrate 100 and the integrated circuit silicon substrate 3 is, the smaller a time for fixing the cooling silicon substrate 100 to the integrated circuit silicon substrate 3 through the covalent bond is.

As shown in FIG. 2, when the cooling substrate 100 contacts directly the integrated circuit substrate 3 without an insert member therebetween and is fixed thereto by the covalent bond (atom-to-atom bonding), reverse surfaces of the cooling substrate 100 and the integrated circuit substrate 3 to be bonded to each other are ground or polished to improve roughness and flatness thereof and to remove oxide (for example, silicon oxide) therefrom. Subsequently, before the oxide is formed on at least one of the reverse surfaces, alternatively, while preventing the oxide from being formed thereon in a vacuum condition, non-oxygen condition (for example, nitrogen gas filled) or deoxidizing gas filled condition, the cooling substrate 100 and the integrated circuit substrate 3 are made contact each other by pressing them against each other and are heated at about 400° C. to be fixed to each other by the covalent bond generated and accelerated by the heating. In this case, at least one of the reverse surfaces may include a thick oxide layer thereon, and may include a significantly thin oxide as formed by the atmosphere. It is preferable for at least one of the reverse surfaces to be substantially fresh or pure without the oxide or the like, or to include the significantly thin oxide as formed by the atmosphere. Even when both of the reverse surfaces include respectively the thick oxide layers, they can be joined each other by the covalent bond therebetween, but it is not effective for improving a strength of the joint that both of them include the thick oxide layers. When at least one of them includes the thick oxide layer or the significantly thin oxide layer, it is not necessary for the substrates 100 and 3 to be heated in the vacuum, non-oxygen or deoxidizing gas filled condition.

At least one of the reverse surfaces (preferably, both thereof) may be coated with a gold layer by a sputtering or vapor deposition, before bonding the cooling substrate 100 and the integrated circuit substrate 3 to each other through the covalent bond between the gold layer and the one of the reverse surfaces and between the gold layer and another one of the reverse surfaces, or between the gold layer and each of the reverse surfaces and between the gold layers on the respective reverse surfaces.

The insert member meltable during the bonding, made of, for example, a lead-tin alloy, a gold-silicon alloy or the like, may be arranged between the cooling substrate 100 and the integrated circuit substrate 3 so that the cooling substrate 100 and the integrated circuit substrate 3 are joined by the heating through the covalent bond between the insert member and each of the reverse surfaces. The insert member may be replaced by a combination of a lead layer arranged on one of the reverse surfaces and a tin layer arranged on another thereof. The gold-silicon alloy has high chemical stability and high thermal conductivity (about 30 W/m-K).

Figure 4:
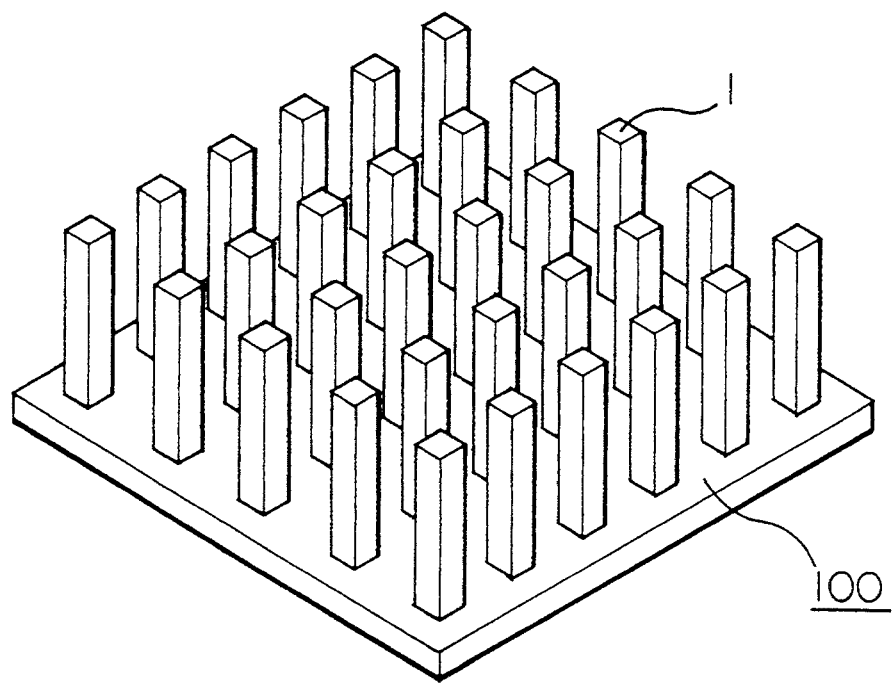
FIG. 4 is a schematic view showing a fin structure according to the present invention.

The fins 1 may have column shape (about 50 micrometer width, width: height = 1: more than 10) as shown in FIG. 4. The column shaped fins 1 can generate a constant multi-direction coolant flow from a center of the cooling substrate 100 to an outer periphery thereof. The column shaped fins 1 can be formed by an anisotropic etching. Forward edges of the surface roughness of the fins 1 form boiling cores for accelerating the vaporization of the coolant. The residual stress of the surfaces of the fins 1 may be released by the wet etching after the anisotropic etching. When the fins 1 are arranged straight, a pressure loss of the flowing coolant is decreased.

Figure 5:
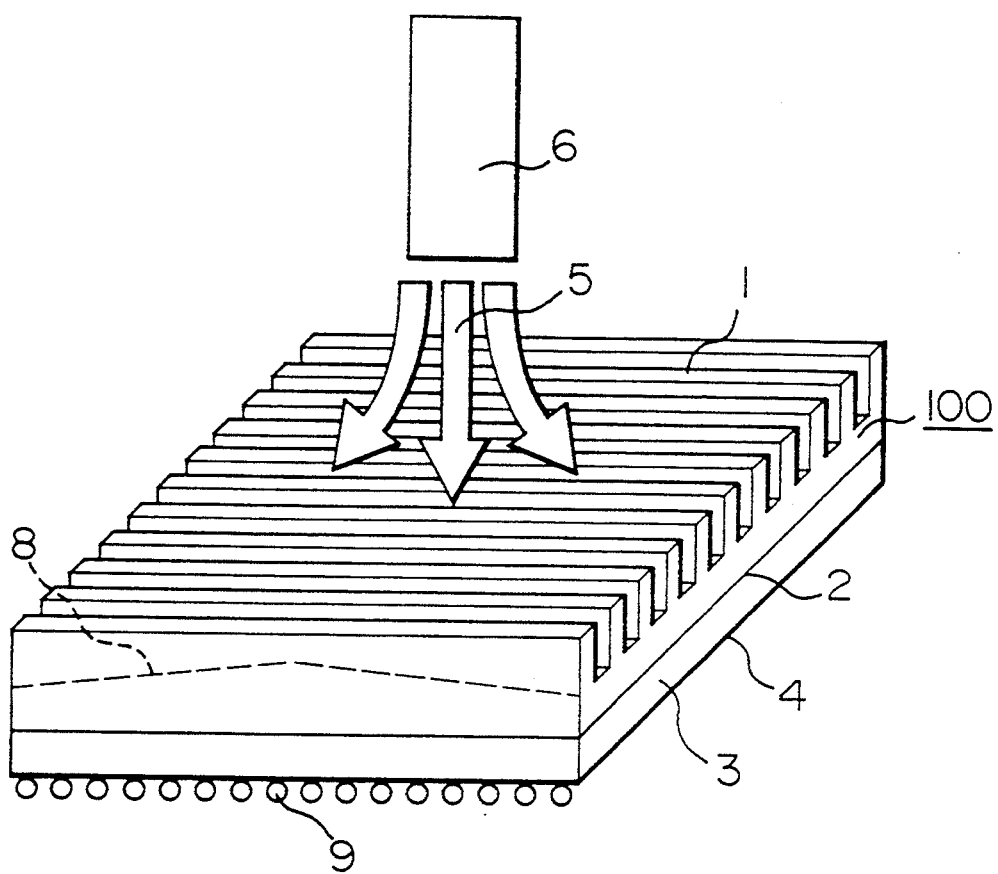
FIG. 5 is a schematic view showing another fin structure according to the present invention.

As shown in FIG. 5, depths of the fins 1 may increase in a coolant flow direction from the center of the cooling substrate 100 over which the coolant nozzle 6 is arranged toward the outer periphery thereof, so that the coolant 5 flows smoothly over the whole range of bottom portions 8 of the fins 1 in the coolant flow direction.

Figure 6:
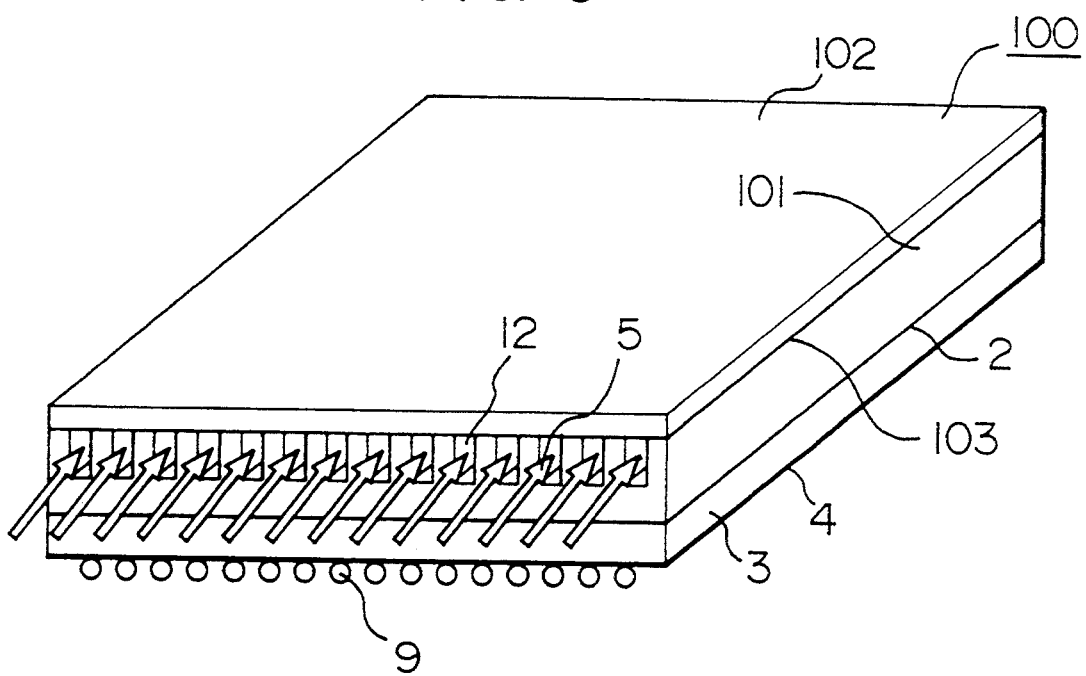
FIG. 6 is a schematic view showing another fin structure according to the present invention.

As shown in FIG. 6, the cooling substrate 100 may include coolant passages 12 defined by wall portions 101 of the cooling substrate 100 and by a cover 102. The cover 102 is fixed onto the cooling substrate 100 with an interface 103 by the covalent bond as described before. The coolant 5 is preferably an electrical insulator. The cooling substrate 100 and the integrated circuit substrate 3 may be immersed in the electrically insulating coolant 5 of liquid type, or may be cooled by the electrically insulating coolant 5 of gas type.

Figure 7:
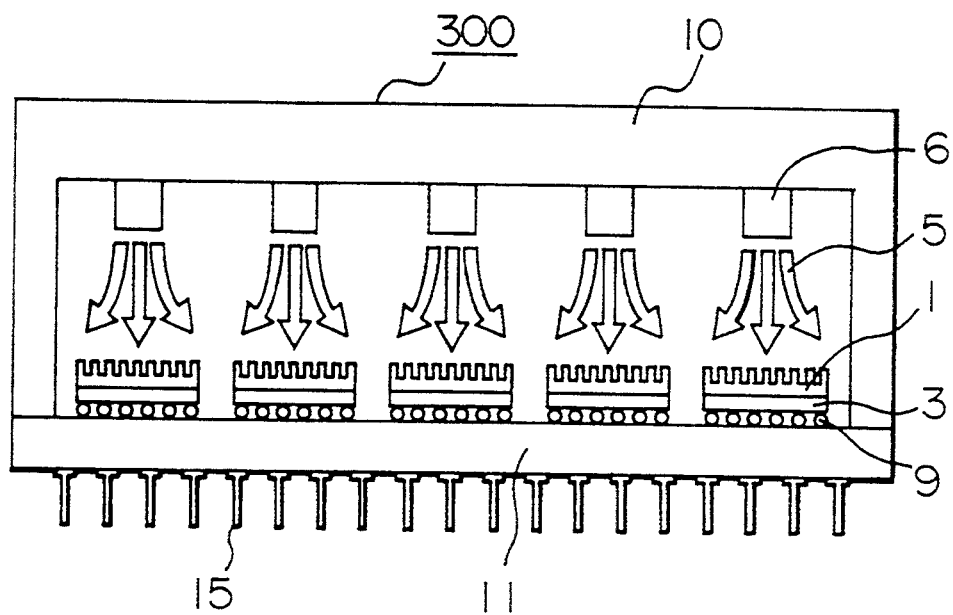
FIG. 7 is a schematic view showing an actual module including a plurality of joined-substrates units.

As shown in FIG. 7, a module 300 has a cover 10 receiving a plurality of the combinations of the cooling substrates 100 and the integrated circuit substrates 3 with the terminals 9, and the nozzles 6 for injecting the coolant 5 toward the cooling substrates 100, and a module substrate 11 through which the integrated circuits are electrically connected to input-output pins 15. The cover 10 has a coolant supply path (not shown) through which the coolant 5 is supplied to the nozzles 6, and a coolant discharge path (not shown) through which the coolant 5 is discharged from the module 300. This module 300 may be used in a large-capacity computer system.

Figure 8:
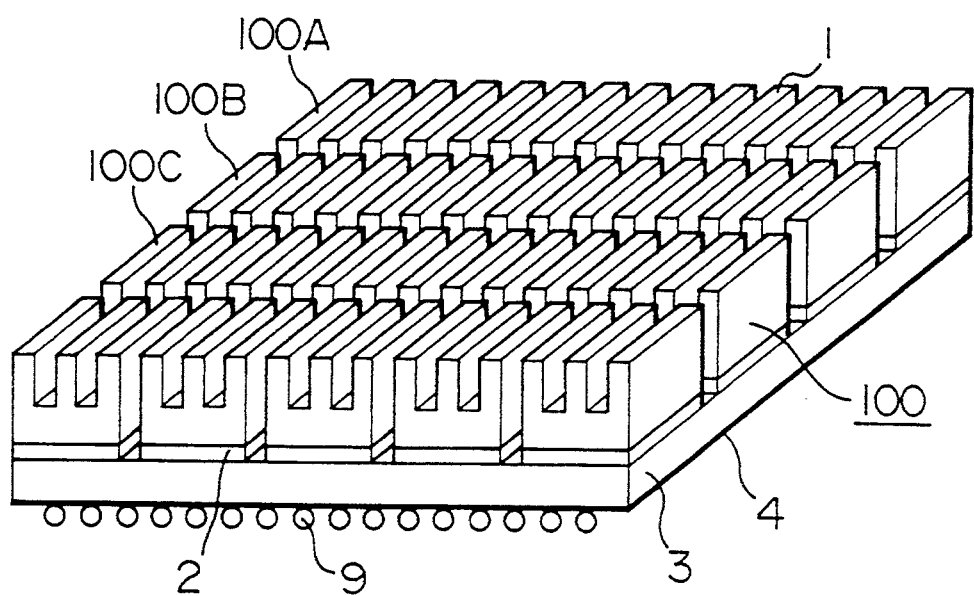
FIG. 8 is a schematic view showing another actual module including a plurality of joined-substrates units.

As shown in FIG. 8, a plurality of the cooling substrates 100 may be fixed onto the integrated circuit substrate 3. In this structure a size of each of the cooling substrates 100 may be small than that of the integrated circuit substrate 3, and the cooling substrates 100 can be formed easily and securely to improve the yield of forming the cooling substrates 100.

The cooling substrates 100 is composed of a plurality of kinds thereof whose heat exchange coefficients are different from each other. When the cooling substrates 100 of a large heat exchange coefficient kind is arranged on a part of the integrated circuit substrate 3 where a large heat energy is generated and the cooling substrates 100 of a small heat exchange coefficient kind is arranged on another part of the integrated circuit substrate 3 where a small heat energy is generated, a temperature is substantially constant over the whole of the integrated circuit substrate 3, and a high-speed operation of the integrated circuit is not affected by the temperature increase.

Figure 9:
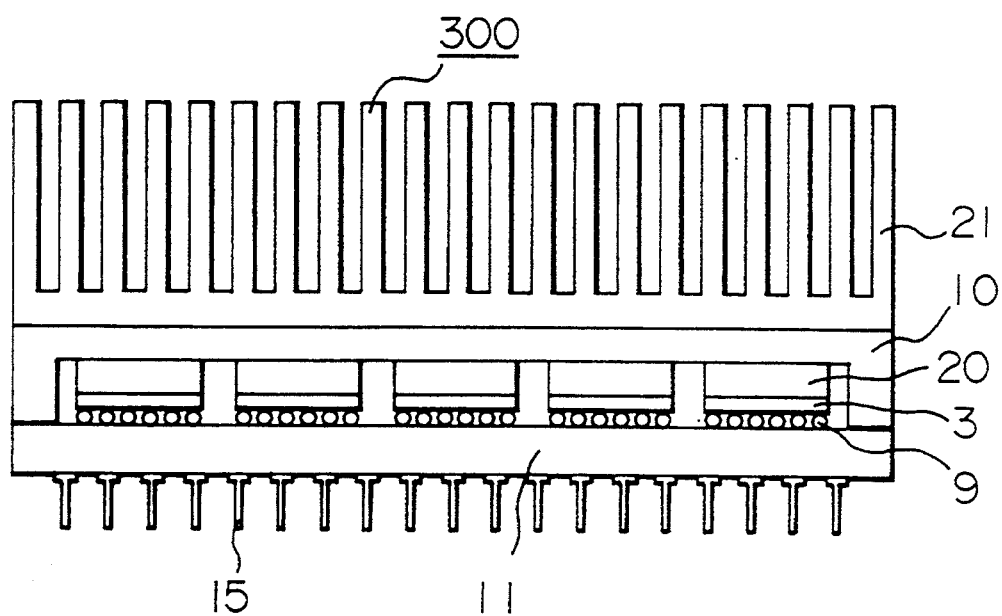
FIG. 9 is a schematic view showing another actual module including a plurality of joined-substrates units each of which has a Peltier effect semiconductor elements thereon.

As shown in FIG. 9, the heat exchange between the integrated circuit substrate 3 and the coolant 5 may be accelerated by a Peltier effect element 20 formed on each of the cooling substrates 100 and fins 21 fixed onto the cover 10. The cover 10 is mounted onto the cooling substrates 100. A heat energy intake side of the Peltier effect element 20 is connected to the integrated circuit substrate 3 and a heat energy discharge side thereof is connected to the cover 10. The heat energy discharge side of the Peltier effect element 20 may be directly exposed to the coolant 5. When a space confined by the module substrate 11 and the cover 10 may be filled by helium gas or electrically insulating oil both of which have a large heat conductivity, to improve the heat transmission between the cover 10 and the heat energy discharge side of the Peltier effect element 20.

Figure 10:
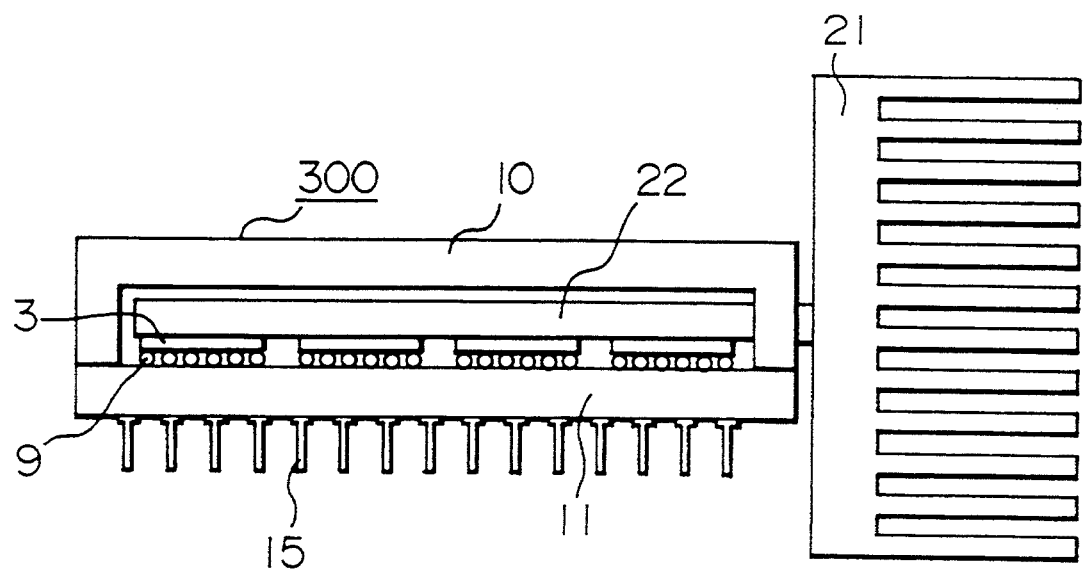
FIG. 10 is a schematic view showing another actual module including a plurality of joined-substrates units each of which has a heat pipe therein.

As shown in FIG. 10, the cooling substrate 100 may include a heat pipe 22 extending through the cover 10 to the fins 21. The heat energy generated by the integrated circuits is transmitted from the integrated circuit substrate 3 through the heat pipe 22 in the cooling substrate 100 to the fins 21. In this structure, a distance between the integrated circuit substrate 3 and the fins 21 can be elongated by the heat pipe 22 so that a size of the fins 21 can be large to improve the heat transmission between the fins 21 and the coolant 5.

What is claimed is:

1. A method for producing joined first and second substrates whose base components are silicon, comprising the steps of:

preparing the first substrate for an integrated electronic semiconductor circuit;

preparing the second substrate for a cooling accelerator for accelerating a heat energy exchange between the integrated electronic semiconductor circuit and a cooling fluid, wherein at least one of a surface of the first substrate and a surface of the second substrate to be joined to each other includes oxide; and forming a covalent bond between the first substrate and the second substrate with pressing them closely against each other in non-oxygen circumferential condition to join fixedly the second substrate with the first substrate, after the preparations.

2. A method according to claim 1, wherein a base component of each of the first and second substrates is a gallium arsenide (GaAs) compound.

3. A method according to claim 1, wherein the cooling accelerator is a surface unevenness of the second substrate for increasing a surface area of the second substrate.

4. A method according to claim 1, wherein the cooling accelerator is a Peltier effect semiconductor element formed on the second substrate.

5. A method according to claim.1, wherein the cooling accelerator is a heat pipe formed in the second substrate.

6. A method according to claim 1, wherein the cooling accelerator is hole means extending through the second substrate.

7. A method according to claim 1, wherein a purity of a base component of the first substrate is higher than that of the second substrate.

8. A method according to claim 1, wherein the covalent bond for joining the second substrate and the first substrate is formed after the integrated electronic semiconductor circuit is substantially formed on the first substrate.

9. A method according to claim 1, wherein the covalent bond for joining the second substrate and the first substrate is formed before the integrated electronic semiconductor circuit is substantially formed on the first substrate.

10. A method according to claim 1, wherein the covalent bond for joining the second substrate and the first substrate is formed after the cooling accelerator is substantially formed on the second substrate.

11. A method according to claim 1, wherein the covalent bond for joining the second substrate and the first substrate is formed before the cooling accelerator is substantially formed on the second substrate.

* * * * *